United States Patent
Kim et al.

(10) Patent No.: US 6,845,668 B2
(45) Date of Patent: Jan. 25, 2005

(54) GYROSCOPE

(75) Inventors: Yong-Kweon Kim, Seoul (KR); Seong-Hyok Kim, Seoul (KR)

(73) Assignee: Intellimicrons Co., Ltd., Seoul (KR)

( * ) Notice: Subject to any disclaimer, the term of this patent is extended or adjusted under 35 U.S.C. 154(b) by 0 days.

(21) Appl. No.: 10/257,532

(22) PCT Filed: Jan. 30, 2002

(86) PCT No.: PCT/KR02/00135
§ 371 (c)(1),
(2), (4) Date: Mar. 25, 2003

(87) PCT Pub. No.: WO02/064497
PCT Pub. Date: Aug. 22, 2002

(65) Prior Publication Data
US 2003/0159509 A1  Aug. 28, 2003

(30) Foreign Application Priority Data
Feb. 12, 2001  (KR) ................................. 2001-0006695

(51) Int. Cl.$^7$ ................................................ G01P 9/04
(52) U.S. Cl. ................................. 73/504.14; 73/504.12
(58) Field of Search .................. 73/504.14, 504.12, 73/504.02, 504.04, 504.16

(56) References Cited

U.S. PATENT DOCUMENTS 5,728,936 A * 3/1998 Lutz ........................ 73/504.14
5,914,521 A * 6/1999 Gutteridge et al. ........ 73/514.32
5,945,599 A * 8/1999 Fujiyoshi et al. ......... 73/504.12
6,122,961 A * 9/2000 Geen et al. ............... 73/504.12
6,242,276 B1   6/2001 Baek et al.

FOREIGN PATENT DOCUMENTS

| KR | 0042067 | 6/1999 |
| WO | WO0068640 | 11/2000 |

* cited by examiner

Primary Examiner—John E. Chapman
(74) Attorney, Agent, or Firm—Baker Botts LLP

(57) ABSTRACT

A gyroscope which comprises: a driving fixed electrode (26) being fixed; a driving displacement electrode (24) being opposite to the driving fixed electrode, and being able to be displaced in a first direction; an inertial mass (23) being connected to the driving displacement electrode (24), being displaced in the first direction according to the first directional displacement of the driving displacement electrode (24), and being displaced in a second direction when an angular rate is applied; a sensing displacement electrode (22) being connected to the inertial mass (23), and being able to be displaced in the second direction according to the second directional displacement of the inertial mass (23); and a sensing fixed electrode (25) being opposite to the sensing displacement electrode and being fixed. The driving displacement electrode (24) is supported by a folded spring (31) movable in the first direction, and the sensing displacement electrode is supported by a folded spring (32) movable in the second direction.

7 Claims, 9 Drawing Sheets

GYROSCOPE

BACKGROUND OF THE INVENTION (a) Field of the Invention

The present invention relates to a micromachined gyroscope and a fabrication method thereof.

(b) Description of the Related Art

Micro inertial sensors are one application among various application fields of micromachining techniques. Since micromachined inertial sensors made of silicon are inexpensive, mass-producible, and can be integrated, researches on commercial inertial sensors have been actively performed during the past decade. However, while actual commercial gyroscopes were fabricated and produced a few years ago, micromachined gyroscopes have not been commercialized yet. For their commercialization, it is required to discriminate low output values from noise, selectively sense the low output values and obtain high sensitivity together with wide operation ranges. It is further required to use a process that is perfectly compatible with that of conventional semiconductors or to use a simpler process to implement inexpensive elements. Also, the elements' reliabilities and high yield must be guaranteed.

In 1998, Analog Devices Inc. (ADI) used the surface micromachining process to develop integrated gyroscope prototypes operating in a vacuum environment with the goal of producing the gyroscopes for $30. However, since gyroscopes using piezo-electric elements cost $15 for autos and $5 for cameras, a new approach was necessary to compete with these expensive devices. Accordingly, ADI approached development of inexpensive gyroscopes through minimization of element size and packaging processes. To minimize the element size, a circuit portion that occupies the bulk of the element was reduced. The problems caused by reduction of the circuit portion were solved by enlarging the mechanical portion of the gyroscope, thereby reducing the overall size of the element. In addition, when the mechanical portion is enlarged, the element can operate at a low Q value, and thereby two objectives of commercialization are satisfied: a small-sized element and elimination of the vacuum sealing. The vacuum sealing process constitutes 80% of the cost, compared with general IC packaging processes at 50%. It should be required to eliminate the vacuum sealing process for cost down of the gyroscopes.

SUMMARY OF THE INVENTION

It is an object of the present invention to provide a gyroscope operable in atmospheric pressure.

It is another object of the present invention to provide a gyroscope that has a large driving displacement at high frequencies.

It is still another object of the present invention to provide a gyroscope that removes mechanical interference between the driving mode and the sensing mode.

It is further another object of the present invention to provide a gyroscope that produces high sensitivity without frequency tuning.

It is further another object of the present invention to simplify a method for fabricating gyroscopes.

In order to achieve the objects, a driving displacement electrode and a sensing displacement electrode are connected through an inertial mass and a folded spring so as to remove mechanical interference between the driving displacement electrode and the sensing displacement electrode.

In one aspect of the present invention, a gyroscope comprises: a driving fixed electrode being fixed; a driving displacement electrode being opposite to the driving fixed electrode, and being able to be displaced in the first direction; an inertial mass being connected to the driving displacement electrode, being displaced in the first direction according to the first directional displacement of the driving displacement electrode, and being displaced in the second direction when an angular rate is applied; a sensing displacement electrode being connected to the inertial mass, and being able to be displaced in the second direction according to the second directional displacement of the inertial mass; and a sensing fixed electrode being opposite to the sensing displacement electrode and being fixed.

The driving displacement electrode is supported by a folded spring movable in the first direction, and the sensing displacement electrode is supported by a folded spring movable in the second direction.

The driving displacement electrode and the inertial mass can be movable in the second direction and are connected by a folded spring having no fixture shaft, and the sensing displacement electrode and the inertial mass can be movable in the first direction and are connected by a folded spring having no fixture shaft.

Two sensing displacement electrodes are provided on two sides of the inertial mass, and the gyroscope further comprises an edge gimbal for connecting the two sensing displacement electrodes.

A cavity is provided in the center of the inertial mass, and the gyroscope further comprises a displacement limit shaft provided to the center of the cavity and being fixed.

The gyroscope further comprises tuning electrodes, each symmetrically formed on both sides of the sensing displacement electrode, functioning as electrical springs to vary the resonance frequency of the sensing displacement electrode and control sensing sensitivity.

In another aspect of the present invention, a method for fabricating a gyroscope comprises: (a) performing anodic bonding on a silicon substrate and a glass substrate; (b) etching and polishing the silicon substrate to be a predetermined thickness; (c) forming a metallic layer on the silicon substrate; (d) performing photolithography on the metallic layer and the silicon substrate to form a silicon structure having a gyroscope pattern; (e) etching the glass substrate, and separating remaining portions of the silicon structure except a fixture shaft from the glass substrate to form a gyroscope structure; and (f) performing flip chip bonding on the gyroscope structure to connect it to an external circuit.

The method further comprises dicing the silicon substrate and the glass substrate and separating them into respective elements between (d) and (e).

The metallic layer formed in (c) is a double layer of Cr and Au, and the glass substrate is etched using an HF solution in (e).

The depth for etching the glass substrate using the HF solution is set to be greater than 10 $\mu$m so as to minimize air damping and to operate the gyroscope in atmospheric pressure.

The silicon substrate is etched using a KOH aqueous solution of 36 wt. % at 80° C. in (b).

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 1:
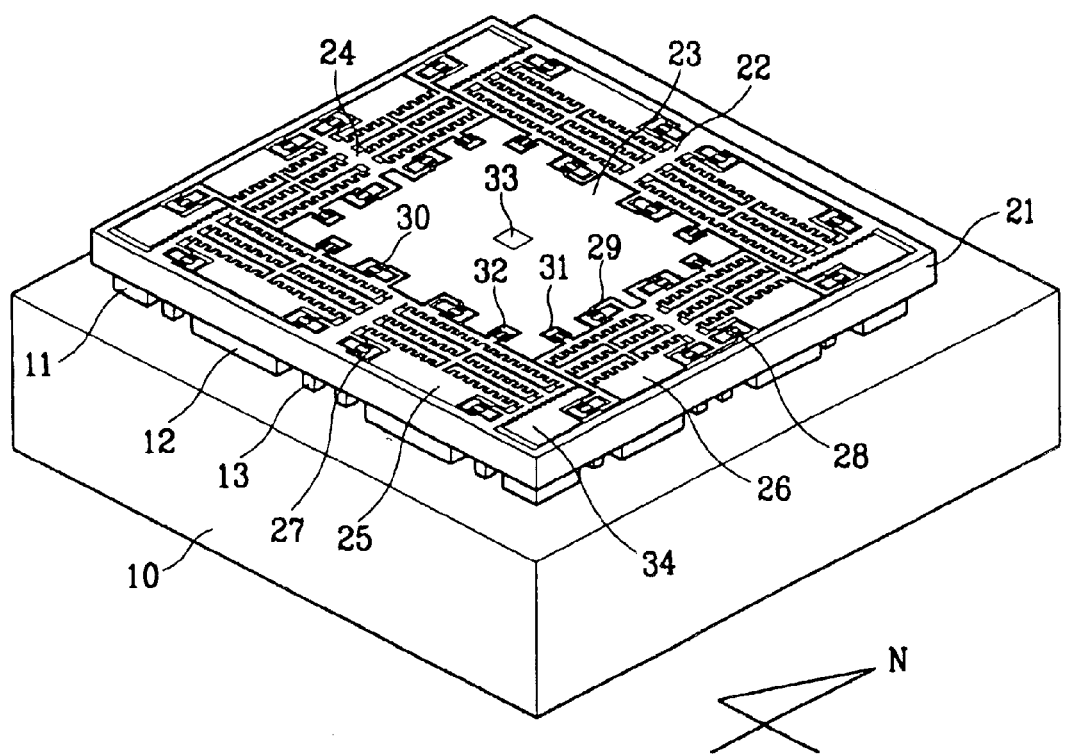
FIG. 1 shows a perspective view of a gyroscope according to a preferred embodiment of the present invention.
Figure 2:
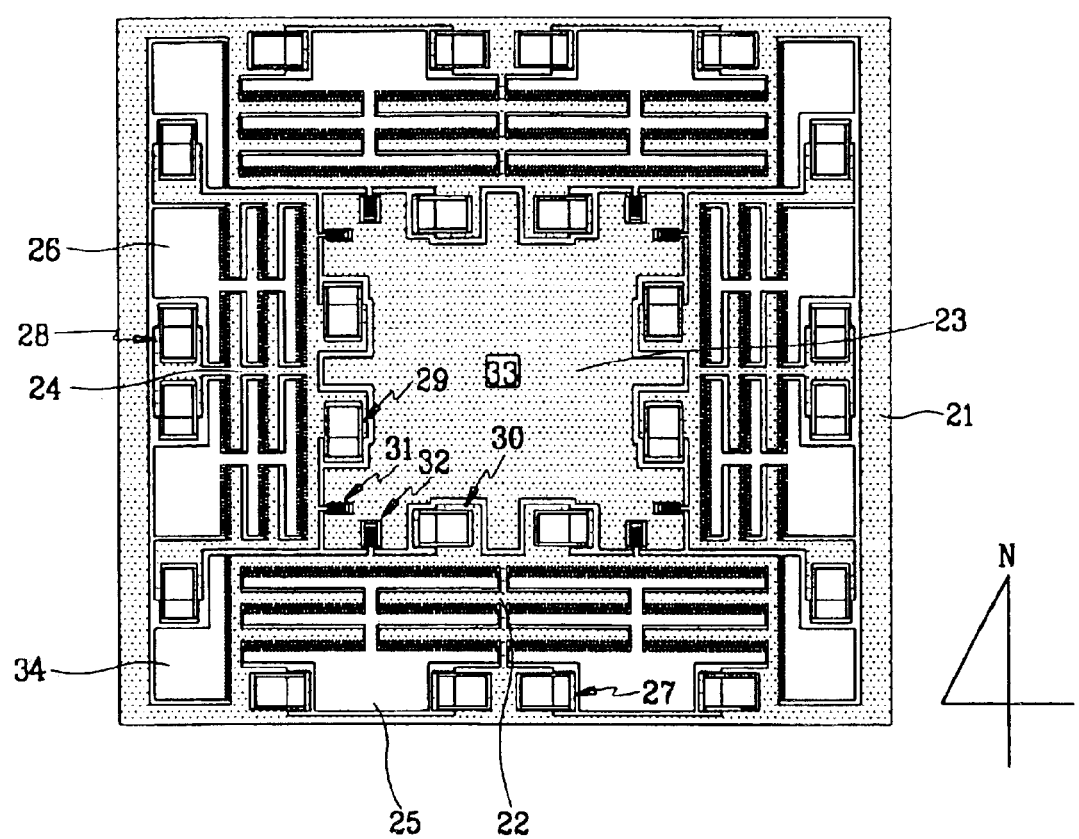
FIG. 2 shows a floor plan of a gyroscope according to a preferred embodiment of the present invention.
Figure 3:
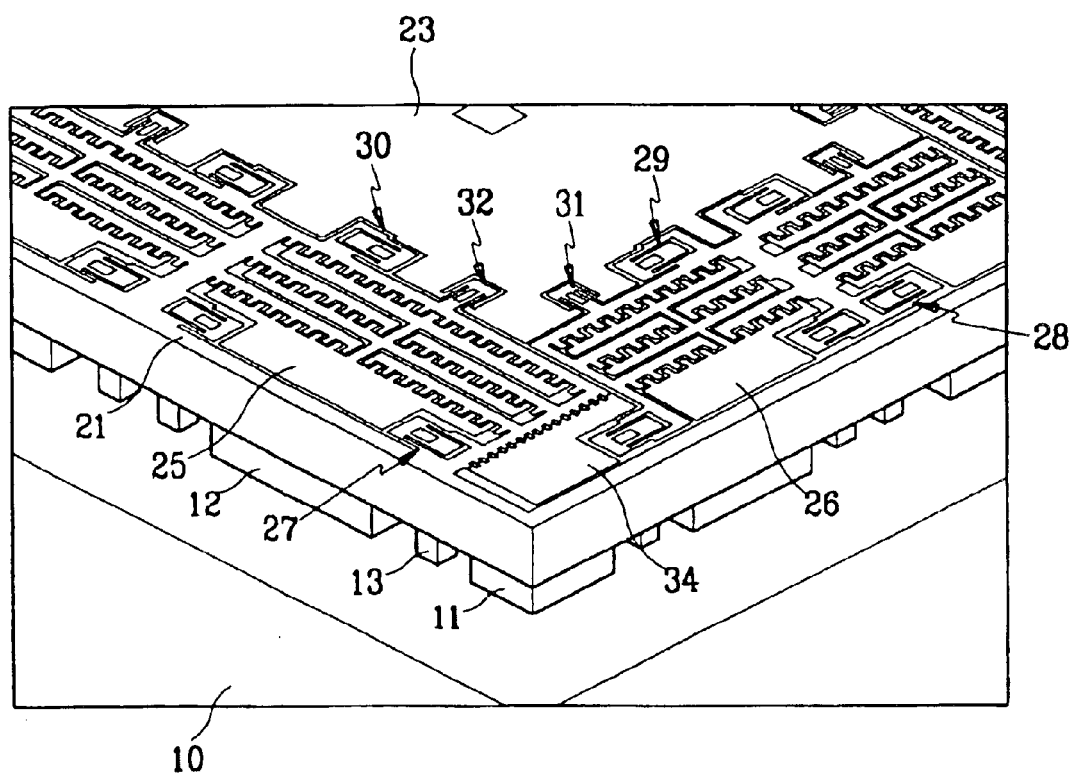
FIG. 3 shows a magnified portion of FIG. 1.
Figure 4:
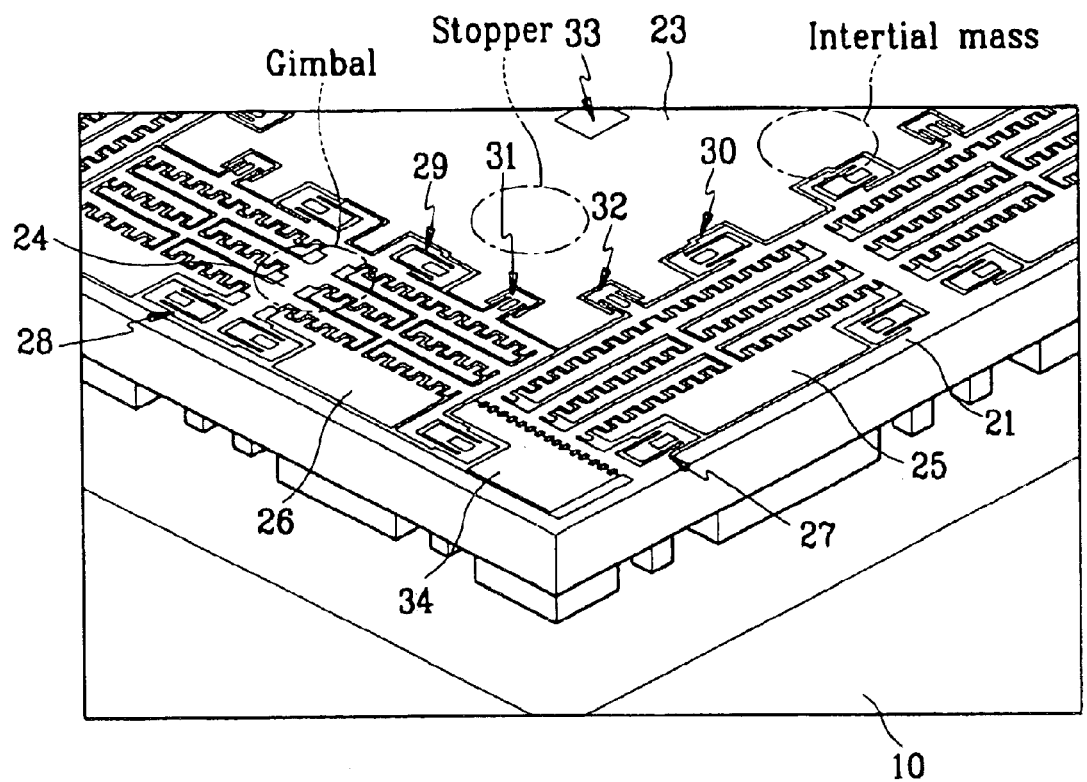
FIG. 4 shows a partial SEM(scanning Electron Microscope) photograph of a gyroscope fabricated according to a preferred embodiment of the present invention.

FIG. 1 shows a perspective view of a gyroscope according to a preferred embodiment of the present invention, FIG. 2 shows a floor plan of a gyroscope according to a preferred embodiment of the present invention, FIG. 3 shows a magnified portion of FIG. 1, and FIG. 4 shows a partial SEM photograph of a gyroscope fabricated according to a preferred embodiment of the present invention.

The gyroscope according to the preferred embodiment of the present invention comprises a glass substrate 10 and a silicon structure formed thereon. Supporting columns 11, 12, and 13 for supporting the silicon structure and fixing a fixture shaft of the silicon structure are formed on the glass substrate 10.

The silicon structure comprises a driver, sensor, a plurality of springs, a tuning electrode 34, and a displacement limit shaft 33. The driver comprises a driving fixing electrode 26, a driving displacement electrode 24, and an inertial mass 23. The sensor comprises a sensing fixing electrode 25, a sensing displacement electrode 22, and an edge gimbal 21. The springs comprise driving springs 28 and 29 for supporting and allowing vibration of the driving displacement electrode 24, sensing springs 27 and 30 for supporting and allowing vibration of the sensing displacement electrode 22 and the edge gimbal 21, a driving connection spring 31 for connecting the driving displacement electrode 24 with the inertial mass 23, and a sensing connection spring 32 for connecting the sensing displacement electrode 22 with the inertial mass 23. The driving springs 28 and 29 are classified as an external driving spring 28 and an internal driving spring 29 respectively, and the sensing springs 27 and 30 are respectively an external sensing spring 27 and an internal sensing spring 30.

A further detailed description of structures and function of these components will now be provided.

The driving fixing electrode 26 of the driver is fixed by the supporting column 12 of the glass substrate 10 and has a spaced toothed portion. The driving displacement electrode 24 is supported by the external and internal driving springs 28 and 29, is movable only in the east to west direction. (refer to the compass direction of FIGS. 1 and 2), and also has a spaced toothed portion. The teeth of the spaced toothed portion of the driving fixing electrode 26 and those of the driving displacement electrode 24 are interspersed with each other. The external and internal driving springs 28 and 29 are fixed by the supporting column 13 of the glass substrate 10, and since they are plate springs and are provided in the south to north direction, they are movable only in the east to west direction. Since the inertial mass 23 is connected to the driving displacement electrode 24 through the driving connection spring 31, when the driving displacement electrode 24 is vibrated in the east to west direction, the inertial mass 23 is vibrated together with the driving displacement electrode 24. In this instance, since the driving connection spring 31 has no fixing shaft and can be movable only in the south to north direction, it delivers east to west vibration of the driving displacement electrode 24 to the inertial mass 23.

Next, the sensing fixing electrode 25 of the sensor, fixed by the supporting column 12 of the glass substrate 10, has a spaced toothed portion. The sensing displacement electrode 22 is supported by the external and internal sensing springs 27 and 30, is movable only in the south to north direction (refer to the compass direction of FIGS. 1 and 2), and also has a spaced toothed portion. The teeth of the spaced toothed portion of the sensing fixing electrode 25 and those of the sensing displacement electrode 22 are interspersed with each other. The external and internal sensing springs 27 and 30 are fixed by the supporting column 13 of the glass substrate 10, and since they are plate springs and are provided in the east to west direction, they are movable only in the south to north direction. The sensing displacement electrode 22 is connected to the inertial mass 23 through the sensing connection spring 32, and accordingly, when the inertial mass 23 is vibrated in the south to north direction, the sensing displacement electrode 22 is vibrated together with the inertial mass 23. In this instance, since the sensing connection spring 32 has no fixing shaft and can be movable only in the east to west direction, the sensing connection spring 32 delivers the south to north directional vibration of the inertial mass 23 to the sensing displacement electrode 22 as it is. The edge gimbal 21 totally surrounds the driver and the sensor, and connects the sensing displacement electrodes 22 positioned on the south and north sides of the inertial mass 23. Therefore, the sensing displacement electrodes 22 on both sides are operated in the identical direction and with the identical displacement.

Each tuning electrode 34, of a total of four, is formed on the east and west sides of the two south to north sensing displacement electrodes 22, and is fixed by a supporting column 11 of the glass substrate 10. A spaced toothed portion is formed on the tuning electrode's surface facing the sensing displacement electrodes 22, and a spaced tooth portion is also formed on the sensing displacement electrode's surface facing the tuning electrode 34. The teeth of the sensing displacement electrodes 22 face those of the tuning electrode 34, and the spaces of the sensing displacement electrodes 22 face those of the tuning electrode 34.

The displacement limit shaft 33, formed in the center of a cavity formed in the center of the inertial mass 23, prevents the inertial mass 23 from being displaced over a predetermined level, and it is fixed by a supporting column (not illustrated) of the glass substrate 10. When the inertial mass 23 is stopped, the displacement limit shaft 33 is separated on one side from the inertial mass 23 by a predetermined gap.

A method for driving the above-structured gyroscope and a sensing method will now be described.

When power is supplied to the driving fixing electrode 26, the driving displacement electrode 24 is electrostatically driven according to the frequency of the power supplied to the driving fixing electrode 26, and it is vibrated in the east to west direction. The inertial mass 23 is also vibrated in the same manner of the driving displacement electrode 24. When torque is applied to the gyroscope under this state, the inertial mass 23 receives the south to north directional force and is vibrated in the south to north direction. The south to north directional vibration of the inertial mass 23 is delivered to the sensing displacement electrode 22 as it is, and the sensing displacement electrodes 22 are vibrated in the same manner. When the sensing displacement electrodes 22 are vibrated, the capacitance generated between the sensing fixing electrode 25 and the sensing displacement electrode 22 is varied, and an angular rate is calculated by sensing the variation. In this instance, the tuning electrode 34 functions as an electric spring, and it varies the resonance frequency of the sensing fixing electrode 25 to adjust sensing sensitivity. The displacement limit shaft 33 limits driving displacement of the inertial mass 23 within a uniform value so as to maintain a uniform displacement in a wide frequency range. This will be described subsequently.

Figure 5:
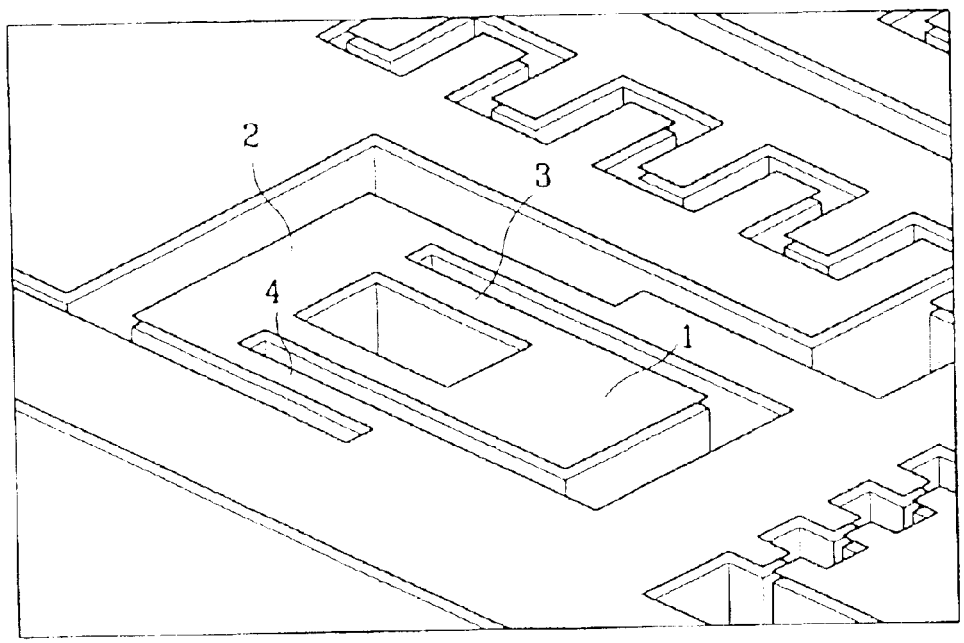
FIG. 5 shows a magnified view of a driving or sensing spring of a gyroscope according to a preferred embodiment of the present invention.
Figure 6:
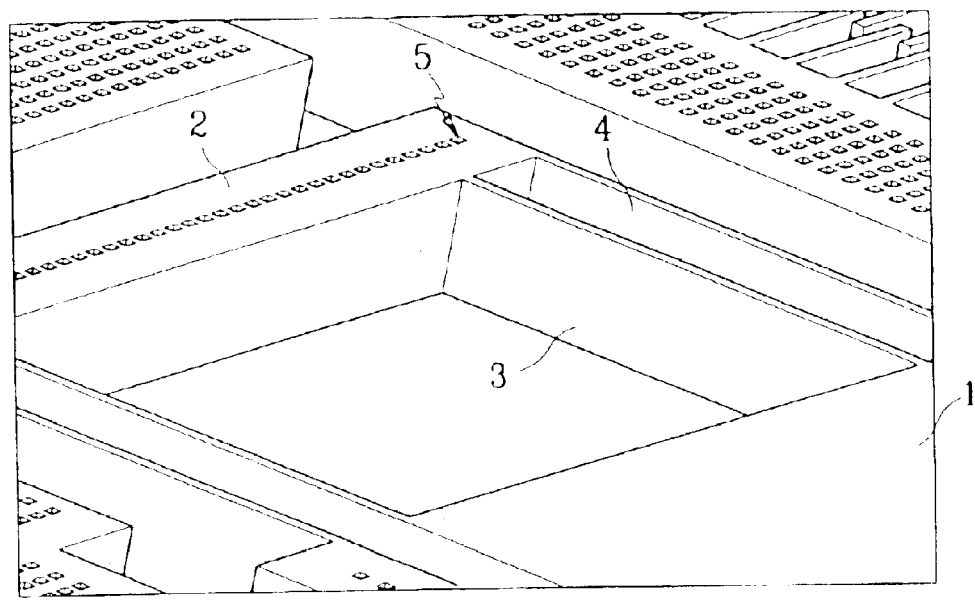
FIG. 6 shows an SEM photograph of a driving or sensing spring of a gyroscope fabricated according to a preferred embodiment of the present invention.

With reference to FIGS. 5 and 6, the structure of the driving or sensing springs 27, 28, 29, and 30 applied to the preferred embodiment of the present invention will be described in detail.

FIG. 5 shows a magnified view of a driving or sensing spring of a gyroscope according to a preferred embodiment of the present invention, and FIG. 6 shows an SEM photograph of a driving or sensing spring of a gyroscope fabricated according to a preferred embodiment of the present invention.

The driving or sensing spring comprises a fixture shaft 1, a connector 2, an internal plate 3 and an external plate 4. The fixture shaft 1 is fixed by the supporting column 13 of the glass substrate 10, and the connector 2 connects the internal plate 3 with the external plate 4. The internal plate 3 connects between the fixture shaft 1 and the connector 2, and the external plate 4 connects between the connector 2 and the driving or sensing displacement electrode (which is determined according to a driving spring or a sensing spring). The spring of this structure is referred to as a folded spring.

Referring to FIG. 5, the thin layer provided on the silicon structure is a metallic layer. This metallic layer is formed to perform flip chip bonding on the gyroscope. FIGS. 1 to 4 omit this illustration.

Referring to FIG. 6, the connector 2 and the cavity formed around the structure are used for injecting etchant when etching the glass substrate so as to raise the structure in the air in the fabrication process. Therefore, the cavities are formed on all portions of the structure except for the fixture shaft and the narrow spring plates 3 and 4.

Figure 7:
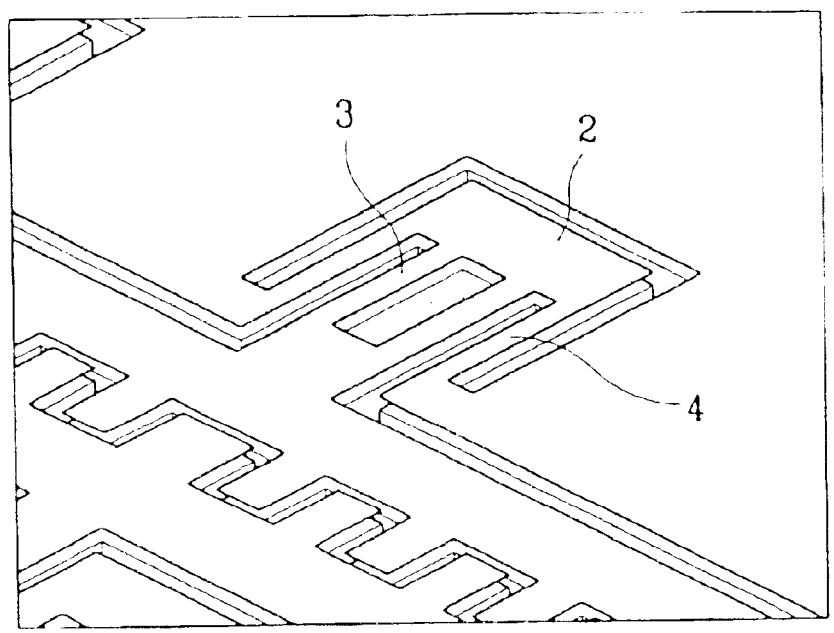
FIG. 7 shows a concept view of a driving or sensing connection spring of a gyroscope according to a preferred embodiment of the present invention.

With reference to FIG. 7, the structures of the driving or sensing connection spring 31 or 32 applied to the preferred embodiment of the present invention will now be described in detail.

FIG. 7 shows a concept view of a driving or sensing connection spring of a gyroscope according to a preferred embodiment of the present invention.

The connection spring comprises a connector 2, an internal plate 3, and an external plate 4, and has no fixture shaft. The connector 2 connects the internal plate 3 with the external plate 4, and the internal plate 3 is connected to either a driving displacement electrode or a sensing displacement electrode (which is determined according to a driving connection spring or a sensing connection spring), and the external plate 4 is connected to the inertial mass 23.

Next, functions of the displacement limiter will be described.

Figure 8:
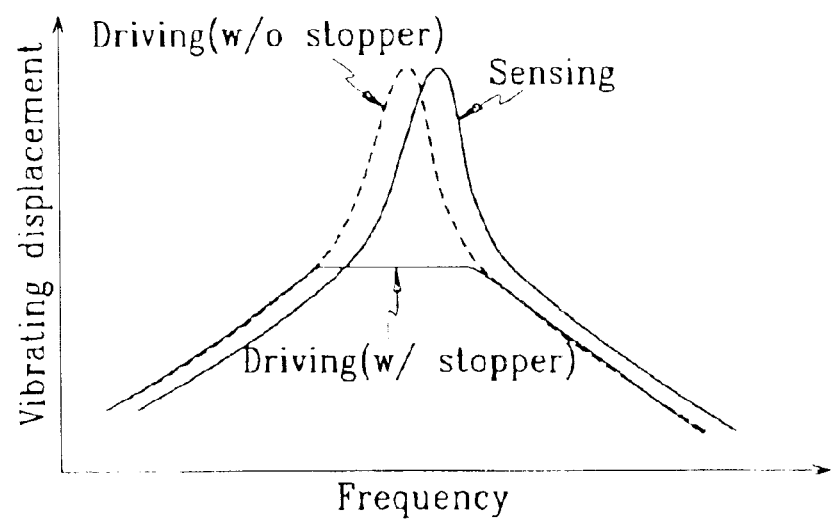
FIG. 8 shows a graph of resonance driving and sensing displacement according to a displacement limiter.

FIG. 8 shows a graph of resonance driving and sensing displacement according to a displacement limiter.

In the case of a resonant structure of a high Q value, since displacement variations according to degrees of vacuum and variations of frequency are very large and corresponding outputs of the structure are accordingly varied, it has a problem in that the output performance is very sensitive to external noise (the degrees of vacuum or variations of frequency). To overcome this problem, the present gyroscope provides a mechanical displacement limiter for limiting driving displacement to the center portion of the inertial mass, so that the displacement of the inertial mass and the driver is maintained at a uniform value and uniform displacement is maintained in a wide frequency range. Also, as shown in FIG. 8, while in the case of conventional gyroscopes the resonance frequency needs to be tuned in order to prevent lowering of sensitivity when the driving and sensing resonance frequencies are different because of process errors, in the case of the present gyroscope that adopts a displacement limiter, the driving displacement is uniformly maintained in the frequency range of wide driving displacement and the driving displacement is uniformly maintained in the sensing resonance frequency range, and hence, the gyroscope can be operated in the sensing resonance frequency without additional tuning.

A method for fabricating the above-structured gyroscope will now be described.

FIGS. 9(a) to 9(h) show a process for fabricating a gyroscope according to a preferred embodiment of the present invention.

Figure 9A:
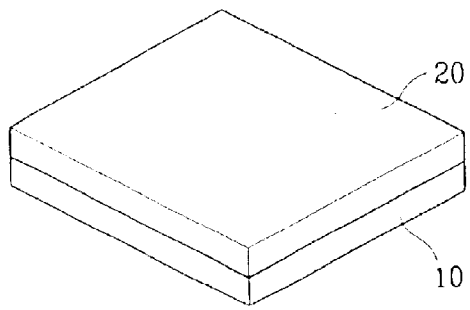
FIGS. 9(a) to 9(h) show a process for fabricating a gyroscope according to a preferred embodiment of the present invention.

As shown in FIG. 9(a), 800 volts (V) at 380° C. are supplied to a low resistive silicon wafer 20 and a glass substrate 10 such as Pyrex #7740 for two hours to perform anodic bonding.

Figure 9E:
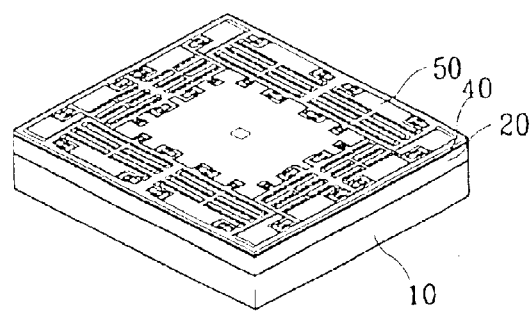
Figure 9B:
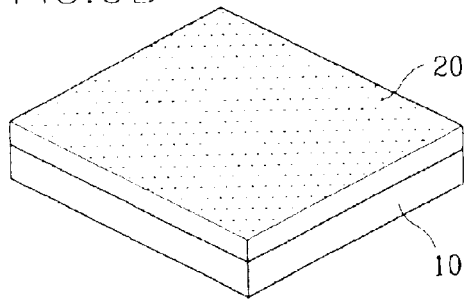

As shown in FIG. 9(b), the silicon wafer 20 is etched using a KOH aqueous solution. After the etching, the thickness of the silicon wafer 20 becomes about 70 $\mu$m, which represents the addition of the final thickness of the silicon structure that is 50 $\mu$m and an extra thickness of 20 $\mu$m for generating a mirror surface through chemical mechanical polishing (CMP.) In this instance, the etchant is a 36 wt. % KOH aqueous solution, used at 80° C., and the corresponding etching speed is about 0.93 $\mu$m/min. After the KOH etching, hillocks and pit holes are formed on the silicon surface.

Figure 9F:
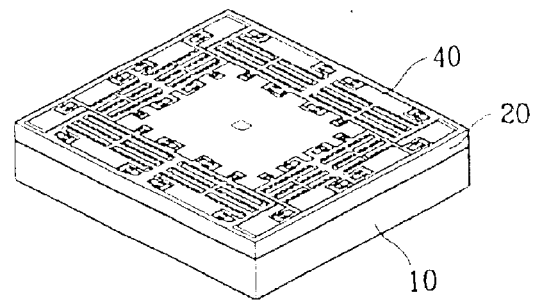
Figure 9C:
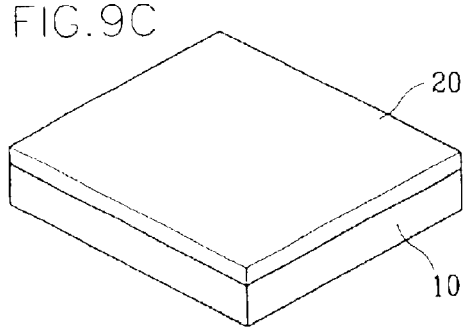

As shown in FIG. 9(c), the surface of the silicon wafer 20 is processed to be a mirror surface through the CMP.

Figure 9G:
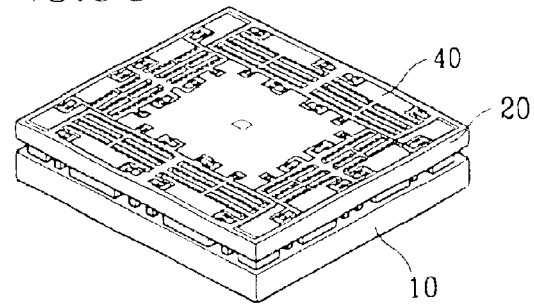
Figure 9D:
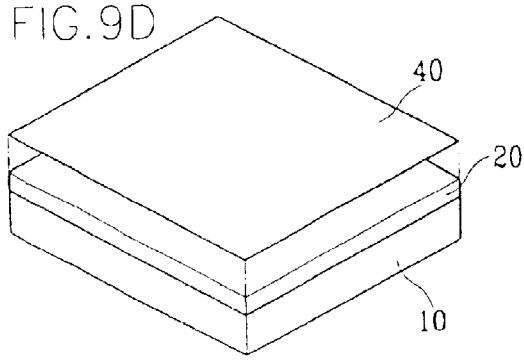

As shown in FIG. 9(d), in order to form an electrode for flip chip bonding, Cr and Au are deposited in the respective thickness of 200 and 300 Å to form a Cr/Au layer 40.

In FIG. 9(e), an oxidized layer (not illustrated) is deposited on the Cr/Au layer 40, photoresist is coated thereon, and a photo process is performed to form a photoresist pattern 50 for defining a silicon structure pattern. In this instance, the photoresist pattern includes a pattern for forming an etchant penetration cavity needed for etching the glass substrate and floating the silicon structure.

As shown in FIG. 9(f), the oxidized layer is etched using the photoresist pattern 50 as an etching mask, and reactive ion etching (RIE) is executed using the photoresist pattern 50 and the oxidized layer as etching masks to form a silicon structure pattern. The silicon wafer 20 and the glass substrate 10 on which the silicon structure pattern is formed are then diced and split into cells.

As shown in FIG. 9(g), in order to separate the silicon structure 20 from the glass substrate 10, the glass substrate 10 is etched in a 49% HF solution. In this instance, as described above, cavities are formed on all portions of the silicon structure except the fixture shaft and the plate of the spring so that the etchant may reach the glass substrate 10. Here, by floating the structure above the glass substrate with a sufficient distance to minimize air damping, gyroscopes that operate in atmospheric pressure can be fabricated, and when glass etching using the HF solution, a structure that floats above the glass substrate by at least 10 $\mu$m can be fabricated. In this instance, the structure must be floated above the glass substrate with full distance to minimize the air damping. By etching the glass substrate 10 for about 8 minutes, the silicon structure 20 can float above the glass substrate 10 with the gap of about 50 $\mu$m.

Figure 9H:
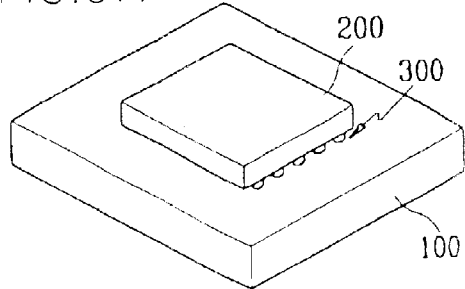

As shown in FIG. 9(h), finally, a gyroscope structure 200 comprising the glass substrate 10, the silicon structure, and the Cr/Au layer 40 is flip-chip-bonded on an electrode structure for wiring on a printed circuit board (PCB) 100. In this instance, a bonder 300 is contacted with fixture shaft portions of the gyroscope structure 200.

In the above, the photoresist and the oxidized layer are used as etching masks when patterning the silicon structure, and further, it is possible to only use the photoresist.

Features of the gyroscope according to the present invention will now be described.

The gyroscope is fabricated based on very simple processes, and the photo etching process for fabricating the gyroscope structure in the whole process is executed once. The fabricated gyroscope has only one structure layer, and flip chip bonding is finally performed so that the gyroscope is connected to a circuit.

The driver and the sensor of the gyroscope structure adopt a combed structure, and are designed to minimize air damping by enlarging the gap from the ground surface and preserve a high Q value in atmospheric pressure so that a Q value equation that has not been considered in the design of conventional gyroscopes may be determined, and the Q value of the structure may be predicted based on the arrangement so as to maximize mechanical sensitivity. In this instance, Couette flow, Stokes flow, and squeeze damping are considered to predict the Q value.

Also, to obtain the maximum sensitivity, a maximal electrode structure is integrated in the given gyroscope region so as to have a large driving displacement of as much as 10 $\mu$m, and a corresponding mechanical structure is designed to minimize mechanical interference of the gyroscope and be insensitive to external noise. The driving and sensing frequencies of the structure are designed to be greater than 5 kHz in order to remove influence of external noise, and the driving and sensing frequencies are designed not to be matched but to be separated by about 50 Hz so as to enlarge the bandwidth. The driving and sensing frequencies are predicted to be 7,088 Hz and 7,132 Hz, respectively.

Further, in the case of the gyroscope according to the present invention, a displacement limiter that artificially limits the displacement is attached to the gyroscope, which maintains the driving displacement in the wide frequency range to widen the bandwidth and reduces necessity of tuning.

The gyroscope structure has a form basically identical with a two-dimensional stage, and a driving mode and a sensing mode exist in the identical plane. Since the sensitivity of the gyroscope increases as the inertial mass becomes greater, the whole mass of the gyroscope must be large. Also, the number of combed electrode structures in the structure is maximized in order to maximize the driving and sensing sensitivities, and edge gimbals are adopted in order to minimize mechanical interference. The size of the gyroscope structure is 8×8 mm$^2$, and the whole size, considering an external frame for hermetic sealing, is 10×10 mm$^2$. Single crystal silicon having excellent mechanical features is used as described above, and the thickness of the structure is designed to be 50 $\mu$m. Also, the gyroscope structure is floated above the glass substrate by 50 $\mu$m so as to reduce damping.

As described above, in the case of a structure that vibrates in the horizontal direction, a damping value is to be calculated in order to calculate the Q value, and generally known damping coefficients and equations for calculating them are as follows:

Viscous damping coefficient of Couette flow $$B_{Couette} = \mu \frac{A}{g},$$

where g represents the thickness of air film and A shows the area of a sphere;

Damping coefficient of Stokes flow $$B_{Stokes} = \mu \frac{A}{\delta},$$

where $\delta$ represents a penetration depth to be defined as $$\delta(\omega) = \sqrt{\frac{2\nu}{\omega}},$$

and A indicates the area of the structure;

Squeeze damping coefficient $$B_{Hagen} = 7.2 \mu l \left(\frac{h}{g}\right)^3,$$

where g represents the thickness of air film between two plates, l is the superimposed length of the structure, and h indicates the height of the structure.

$$Q \text{ factor} = \frac{\sqrt{K_{SYSTEM} M_{SYSTEM}}}{B} = \frac{\sqrt{K_{SYSTEM} M_{SYSTEM}}}{B_{Couette} + B_{Stokes} + B_{Hagen}},$$

where $\mu$ represents the air's absolute viscosity (1.78×10$^{-5}$[N·s/m$^2$]).

The driver has 426 combed electrode structures and 6 folded spring structures for driving. When the length of the spring is set to be 192 $\mu$m, the spring coefficient is calculated to be 2,684 and the driving resonance frequency to be 8,299 Hz. The Q factor in atmospheric pressure is calculated considering the size of the whole structure to be 3,565.

When the driving voltage is set to be $V(t)=v_d+v_s \cos \omega_{DRIVE} t = 15+3 \cos(2\pi \cdot f_{DRIVE} \cdot t)[V]$, the driving force and the driving displacement are calculated as follows.

Driving force:

$$F(t) = 4 \cdot \varepsilon_0 \cdot N_{DRIVE} \cdot \frac{h}{g} \cdot v_d \cdot v_s \cdot \cos\omega_{DRIVE} t =$$

$$6.789 \times 10^{-6} \cos\omega_{DRIVE} t \quad [N]$$

Driving displacement:

$$x(t) = 4 \cdot \varepsilon_0 \cdot N_{DRIVE} \cdot \frac{h}{g} \cdot v_d \cdot v_s \cdot \frac{Q_{DRIVE}}{K_{DRIVE}} \cdot \cos\omega_{DRIVE} t =$$

$$9.017 \cos\omega_{DRIVE} t \quad [\mu m]$$

The detector has 692 combed electrode structures and 6 folded springs. When the length of the spring is set to be 157 μm, the resonance frequency of the detector is 8,269 Hz which is marginally less than the driving resonance frequency. The Q factor of the detector is calculated to be 3,765. In this instance, the Coriolis force generated by an input angular rate and the corresponding displacement are calculated as follows.

Coriolis force:

$$F_{CORIOLIS} = 2M_{SHUTTLE} V \cdot \Omega =$$

$$2M_{SHUTTLE} \cdot 4\varepsilon_0 N_{DRIVE} \frac{h}{g} v_d v_s \frac{Q_{DRIVE}}{K_{DRIVE}} \omega_{DRIVE} \sin\omega_{DRIVE} t \cdot \Omega_{rad} =$$

$$1.126 \times 10^{-8} \sin\omega_{DRIVE} t \cdot \Omega_{deg}$$

Sensing displacement:

$$y(t) = \frac{Q_{SENSE}}{K_{SENSE}} \cdot F_{CORIOLIS} = 0.008 \sin\omega_{SENSE} t \quad [\mu m/(deg/sec)]$$

Therefore, the mechanical sensitivity of the gyroscope is calculated to be 0.008[μm(/deg/sec)], and the electrical sensitivity to be 1.939[fF/deg/sec].

The process for fabricating the gyroscope according to the present invention adopts a single structure layer deep RIE process and a silicon-glass anodic bonding process. By using these, the gyroscope structure can be fabricated through a single photo etching process, and it can be completed through flip chip bonding with an electrode substrate and a PCB.

The oxidized layer used as a deep RIE etching mask undergoes an undercut in the process of patterning the oxidized layer by an Oxford etcher, which is reflected to the silicon structure, and finally, the structure after the deep RIE is fabricated to be narrower than the conventional one by about 2 μm. The thickness of the fabricated structure is 44 μm, and the deep RIE is executed for 33 minutes. After glass etching for 8 minutes, the structure is completely released from the substrate, and in this instance, the gap between the substrate and the structure is measured to be 37 μm.

The gyroscope according to the present invention has 426 driving electrodes and 692 sensing electrodes, and the driving and sensing electrodes are mechanically separated from each other through the inertial mass. Also, the gyroscope has a displacement limiter provided in the center of the inertial mass for limiting displacement, and the maximum displacement is 15 μm. Further, a gimbal structure for reducing mechanical interference is provided on the outer portion of the element.

In order to check the performance of the fabricated devices, a simple driving performance measurement is done using a probe station of ISRC(Inter university Semiconductor Research Center). In the like manner of the driver, in the case of checking the operation of the sensor, voltage is supplied to measure the resonance frequency and the maximum displacement at a resonance frequency, and fabrication and performance measuring results are shown roughly in Table 1.

TABLE 1

| | Comb | Spring | | Thickness | | Displacement | Frequency |
|---|---|---|---|---|---|---|---|
| | width (μm) | length (μm) | width (μm) | (μm) | Q | (μm) | (Hz) |
| | | Driving | | | | | |
| Design | 5 | 192 | 5 | 44 | 3565 | 9.017* | 8907 |
| Fabricated | 4.3 | 194 | 4.3 | 44 | 2327 | 4** | 6563 |
| | | Sensing | | | | | |
| Design | 5 | 165 | 5 | 44 | 3765 | 0.008/*/s | 8863 |
| Fabricated | 4.3 | 167 | 4.3 | 44 | 2178 | — | 6523 |

Here, * represents a calculated displacement with applied voltage $V(t)=15+3 \cos \omega_{drive} t$ [V](bi-directional), and ** shows a measured displacement with applied voltage $V(t)= 7.5 +7.5 \cos \omega_{drive} t$ [V](uni-directional).

When the voltage is supplied to 23 devices to measure the resonance frequencies, 20 devices successfully checked the operation of the driver, the operation of the sensor, or the operation of the driver and the sensor. The resonance frequencies range between 5,500 and 6,500 Hz, and in particular, they are concentrated in the range between 5,500 and 6,000 Hz. Also, in the case of the devices wherein the resonance of the driver and the sensor are checked, the difference between the two resonance frequencies is checked to be uniformly maintained to be about 50 Hz. In the case of a device where the resonance in the direction of either the driver or the sensor is monitored or in the case of a device that has a large difference between the resonance frequencies, the spring is checked to have been broken or adhesion in a single direction to have been generated.

The displacement at the time of resonance generates a value of less than the actual designed value as shown in Table 1, since the displacement is reduced because of the unidirectional driving, the air damping is increased and the value Q is reduced because the gap between the substrate and the structure is fabricated narrower than that of the designed one, and the gap between the combed electrodes is increased because of footing and undercut of the combed electrode structure.

Also, the driving voltage is artificially increased to check the efficiency of the displacement limiter. In the case the displacement is limited by the displacement limiter, the driving displacement maximum of 15 μm is checked to be maintained in the range of several hundreds Hz, thereby allowing resistance to external noise and obtainment of wide bandwidths.

The present invention provides an electrostatically driven and capacitively sensed angular rate sensor. By using a single crystal silicon micromachining technique, a large gyroscope can be fabricated, and accordingly, a gyroscope operable in atmospheric pressure is provided; and a silicon-glass bonding technique, a silicon etching technique, and flip chip bonding technique are used to fabricate the gyroscope. This represents a very simple process where a gyroscope structure having etching cavities on its front side is provided through a single photolithographic process, and glass etching is executed without an additional photolithographic process. In particular, by using flip chip bonding, the fabricated gyroscope structure can be directly integrated into a circuit without an additional packaging process, and since the gyroscope can be operable in atmospheric pressure, the present gyroscope can solve the problems of the vacuum sealing process of conventional gyroscopes.

The structure is designed so that it may have as many driving and sensing electrodes as possible and as large an inertial mass as possible so as to obtain great sensitivity in atmospheric pressure, and it may have a large driving operation displacement at high frequencies so as to remove influences caused by external noise. Since the gyroscope structure has the driving mode and the sensing mode on the same plane, it adopts an operation principle that can remove mechanical interference of the conventional gyroscope, and it has a perimeter gimbal structure so as to minimize mechanical interference. Further, a displacement limiter for limiting driving displacement is mechanically added so as to provide a gyroscope that has quality sensitivity without additional frequency tuning and to design the operation bandwidth of the gyroscope to be increased.

The fabricated gyroscope is operable in atmospheric pressure, and is very sensitive in atmospheric pressure.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A gyroscope comprising:

a driving fixed electrode being fixed;

a driving displacement electrode being opposite to the driving fixed electrode, and being able to be displaced in a first direction;

an inertial mass being connected to the driving displacement electrode, being displaced in the first direction according to the first directional displacement of the driving displacement electrode, and being displaced in a second direction when an angular rate is applied;

a sensing displacement electrode being connected to the inertial mass, and being able to be displaced in the second direction according to the second directional displacement of the inertial mass; and a sensing fixed electrode being opposite to the sensing displacement electrode and being fixed;

wherein the driving displacement electrode and the inertial mass can be movable in the second direction and are connected by a folded spring having no fixture shaft, and the sensing displacement electrode and the inertia mass can be movable in the first direction and are connected by a folded spring having no fixture shaft.

2. The gyroscope of claim 1, wherein the driving displacement electrode is supported by a folding spring movable in the first direction, and the sensing displacement electrode is supported by a folded spring movable in the second direction.

3. The gyroscope in claim 1, wherein two sensing displacement electrodes are provided, one on each two sides of the inertia mass, and the gyroscope further comprises an edge gimbal for connecting the two sensing displacement electrodes.

4. The gyroscope of claim 1, wherein a cavity is provided in the center of the inertia mass, and the gyroscope further comprises a displacement limit shaft provided to the center of the cavity and being fixed.

5. The gyroscope of claim 1, wherein the gyroscope further comprises tuning electrodes, symmetrically formed on both sides of the sensing displacement electrode, functioning as electrical springs to vary the resonance frequency of the sensing displacement electrode and control sensing sensitivity.

6. The gyroscope of claim 5, wherein spaced tooth shapes are respectively formed on the sensing displacement electrode's surface and on the tuning electrode's surface facing the sensing displacement electrode, and tooth portions of the sensing displacement electrode are facing those of the tuning electrode, and spaces between the tooth portions of the sensing displacement electrode are facing those of the tuning electrode.

7. The gyroscope of claim 1, wherein spaced tooth shapes are provided to the facing sides of the driving fixed electrode and the driving displacement electrode, and to those of the sensing fixed electrode and the sensing displacement electrode, to be interspersed with each other.

* * * * *